United States Patent
Cakmakci et al.

(10) Patent No.: US 12,098,953 B2
(45) Date of Patent: Sep. 24, 2024

(54) EMISSIVE DISPLAY CONFIGURED WITH THROUGH-DISPLAY SPECTROMETER

(71) Applicant: Google LLC, Mountain View, CA (US)

(72) Inventors: Ozan Cakmakci, Sunnyvale, CA (US); Jyothi Karri, San Jose, CA (US); Sangmoo Choi, Palo Alto, CA (US); Ion Bita, Santa Clara, CA (US)

(73) Assignee: Google LLC, Mountain View, CA (US)

( * ) Notice: Subject to any disclaimer, the term of this patent is extended or adjusted under 35 U.S.C. 154(b) by 275 days.

(21) Appl. No.: 17/753,077

(22) PCT Filed: Dec. 16, 2020

(86) PCT No.: PCT/US2020/070913
§ 371 (c)(1),
(2) Date: Feb. 17, 2022

(87) PCT Pub. No.: WO2021/127694
PCT Pub. Date: Jun. 24, 2021

(65) Prior Publication Data
US 2022/0307902 A1 Sep. 29, 2022

Related U.S. Application Data

(60) Provisional application No. 62/949,197, filed on Dec. 17, 2019.

(51) Int. Cl.
*G01J 3/28* (2006.01)
*G01J 3/02* (2006.01)
(Continued)

(52) U.S. Cl.
CPC .......... *G01J 3/2803* (2013.01); *G01J 3/0272* (2013.01); *G01J 3/18* (2013.01); *H04M 1/0266* (2013.01); *H10K 59/00* (2023.02)

(58) Field of Classification Search
CPC .......... G01J 3/2803; G01J 3/0272; G01J 3/18; G01J 3/0256; G01J 3/1895; H04M 1/0266; H10K 59/00; H01L 25/167; G01N 21/25
See application file for complete search history.

(56) References Cited

U.S. PATENT DOCUMENTS

| 6,373,574 B1 | 4/2002 | Gu et al. |
| 9,064,451 B2 | 6/2015 | Lynch et al. |

(Continued)

FOREIGN PATENT DOCUMENTS

| CN | 107076665 | 8/2017 |
| CN | 108496180 A | 9/2018 |

(Continued)

OTHER PUBLICATIONS

KR 20190100838 A (translation) (Year: 2019).*

(Continued)

*Primary Examiner* — Tarifur R Chowdhury
*Assistant Examiner* — Carlos Perez-Guzman
(74) *Attorney, Agent, or Firm* — Fish & Richardson P.C.

(57) ABSTRACT

A mobile computing device includes an emissive display panel, where the panel is used as a grating, and spectrometer optics positioned behind/below the emissive display panel. A mobile computing device includes an emissive display panel and a spectrometer positioned below the emissive display panel. The emissive display panel includes a first periodic pattern of pixels that include one or more LEDs and a second periodic pattern of circuit elements that control the pixels, where the first and second periodic patterns are configured to diffract light received from outside the device, which passes through the emissive display, and where the (Continued)

diffraction is wavelength-dependent. The spectrometer is configured to detect intensities of different wavelength ranges of the diffracted light.

16 Claims, 9 Drawing Sheets

(51) Int. Cl.
*G01J 3/18* (2006.01)
*H04M 1/02* (2006.01)
*H10K 59/00* (2023.01)

(56) References Cited

U.S. PATENT DOCUMENTS

| | | | | |
|---|---|---|---|---|
| 2016/0161402 A1* | 6/2016 | Micheels | ............ | G01N 21/359 250/339.07 |
| 2018/0225498 A1* | 8/2018 | Setlak | ................ | G06V 40/1376 |
| 2020/0264043 A1* | 8/2020 | Allen | .................... | G01J 3/0229 |

FOREIGN PATENT DOCUMENTS

| | | | | |
|---|---|---|---|---|
| CN | 109979382 | A | | 7/2019 |
| CN | 110021240 | A | | 7/2019 |
| CN | 110444125 | A | | 11/2019 |
| JP | H07-120321 | | | 12/1995 |
| JP | 2002-277326 | | | 9/2002 |
| JP | 2011150583 | A | | 8/2011 |
| JP | 2019-512762 | | | 5/2019 |
| JP | 2021-505972 | | | 2/2021 |
| KR | 10-2018-0100140 | | | 9/2018 |
| KR | 20190100838 | A | * | 8/2019 ........... G06F 1/1684 |
| KR | 20190114775 | A | | 10/2019 |
| TW | 201800814 | A | | 1/2018 |
| TW | 201921333 | A | | 6/2019 |
| WO | 2020029563 | A1 | | 2/2020 |
| WO | 2020259473 | A1 | | 12/2020 |

OTHER PUBLICATIONS

Office Action in Japanese Appln. No. 2022-529644, dated Jun. 27, 2023, 15 pages (with English translation).
International Preliminary Report on Patentability for PCT Application No. PCT/US2020/070913, mailed on Jun. 30, 2022, 12 pages.
Office Action in Japanese Appln. No. 2022-529644, mailed on Dec. 5, 2023, 6 pages (with English translation).
Office Action in Chinese Appln. No. 202080065183.9, mailed on Mar. 28, 2024, 25 pages (with English translation).
Office Action in Korean Appln. 10-2022-7009696, mailed on Mar. 5, 2024, 17 pages (with English translation).
International Search Report and Written Opinion for PCT Application No. PCT/US2020/070913, mailed on Mar. 26, 2021, 15 pages.

* cited by examiner

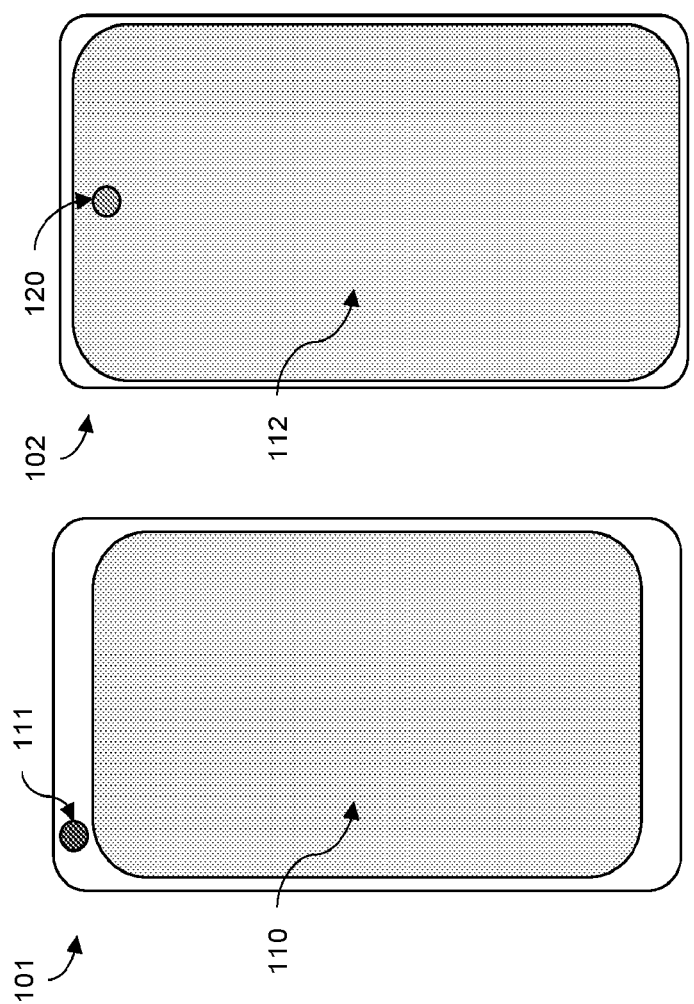

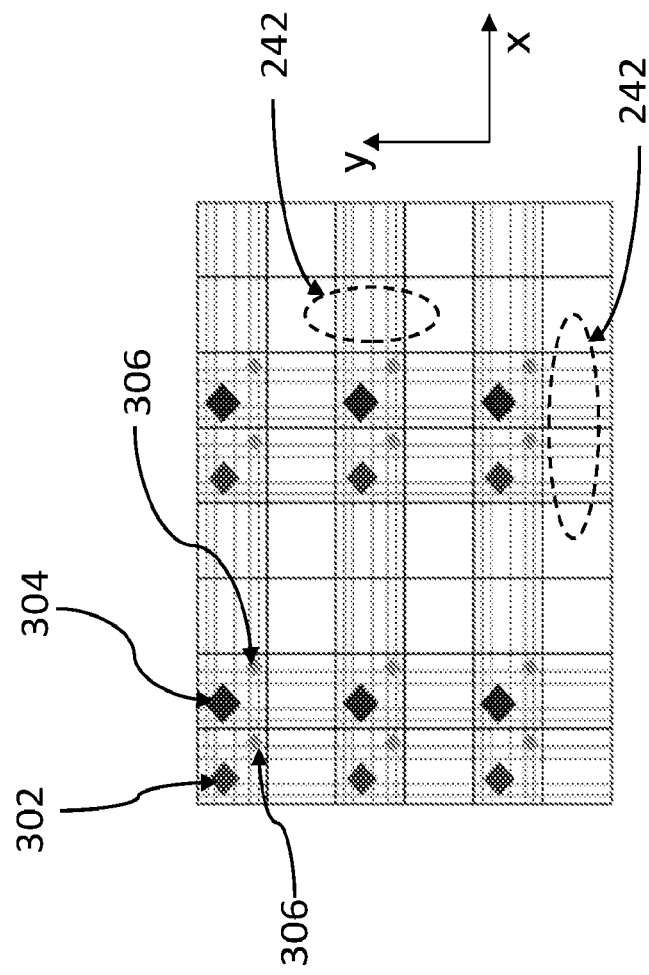
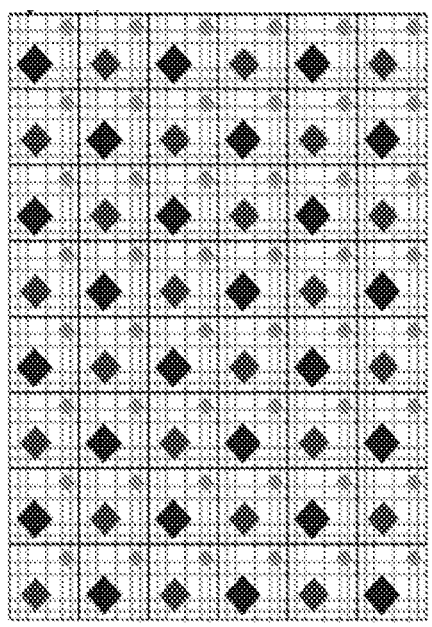
FIG. 3B
FIG. 3A

EMISSIVE DISPLAY CONFIGURED WITH THROUGH-DISPLAY SPECTROMETER

CROSS-REFERENCE TO RELATED APPLICATIONS

This application is a 35 U.S.C. § 371 National Phase Entry Application from PCT/US2020/070913, filed on Dec. 16, 2020, entitled "EMISSIVE DISPLAY CONFIGURED WITH THROUGH-DISPLAY SPECTROMETER", which claims the benefit of U.S. Provisional Application No. 62/949,197, filed on Dec. 17, 2019, entitled "EMISSIVE DISPLAY CONFIGURED WITH THROUGH-DISPLAY SPECTROMETER" the disclosures of which are incorporated herein by reference in their entirety.

TECHNICAL FIELD

The present disclosure relates to flat panel displays and more specifically to displays used in mobile devices, which enable spectrographic sensing through the display.

BACKGROUND

Expanding a display to cover more area of a mobile device (e.g., mobile phone, tablet, etc.) may be desirable from, at least, a user experience standpoint. However, electro-optical devices positioned on a side of the mobile device that also includes the display (e.g., a front-facing camera, a light sensor, a spectrometer, etc.) may compete for real estate on the side of the device that includes the display. Thus, the size of the emissive area of the display may have to be compromised to accommodate other sensors on display side of the device.

SUMMARY

This disclosure describes a mobile computing device having an emissive display panel and a spectrometer, with the spectrometer being located below the display panel. Light detected and analyzed by the spectrometer passes through the display panel and is diffracted, in a wavelength-dependent manner, by elements of the display panel.

In a general aspect, a mobile computing device includes an emissive display panel and a spectrometer positioned below the emissive display panel. The emissive display panel includes a first periodic pattern of pixels that include one or more LEDs and a second periodic pattern of circuit elements that control the pixels, where the first and second periodic patterns are configured to diffract light received from outside the device, which passes through the emissive display, and where the diffraction is wavelength-dependent. The spectrometer is configured to detect intensities of different wavelength ranges of the diffracted light.

Implementations can include one or more of the following features.

For example, the display panel can include an active matrix organic light emitting diode (AMOLED) display panel.

The circuit elements can be arranged to form openings for light to pass through.

The one or more LEDs can be configured to provide light to an object that reflects the light received from outside the device that is diffracted by the periodic patterns.

The spectrometer can include an optical sensor array responsive to intensities of the diffracted light imaged onto different portions of the optical sensor array.

The mobile computing device can include a memory configured for storing a baseline response of the array.

The mobile computing can include a fiber plate between the emissive display panel and the optical sensor array, wherein the fiber plate is configured to image the diffracted light onto the optical sensor array.

The mobile computing device can further include a lens positioned between the emissive display panel and the spectrometer, where the lens is configured to image the diffracted light onto the spectrometer.

The mobile computing device can further include an opaque layer between the emissive display panel and the spectrometer, where the opaque layer includes an aperture configured to allow the diffracted light to pass through the display panel to the spectrometer.

The mobile computing device can further include a processor configured to process signals from the spectrometer, the signals being based on the detected intensities of the different wavelength ranges of the diffracted light, to identify a product from which the diffracted light is received as authentic or genuine.

In another aspect, an emissive display panel can include a first periodic pattern of pixels that include one or more LEDs and a second periodic pattern of circuit elements that control the pixels, where the first and second periodic patterns are configured to diffract light received from outside the device, which passes through the emissive display, where the diffraction is wavelength-dependent, such that the diffracted light can be detected by a spectrometer positioned below the emissive display panel.

Implementation can include on or more of the following features.

For example, the display panel can include an active matrix organic light emitting diode (AMOLED) display panel.

The display panel can include an active matrix organic light emitting diode (AMOLED) display panel.

The circuit elements can be arranged to form openings for light to pass through.

The one or more LEDs can be configured to provide light to an object that reflects the light received from outside the device that is diffracted by the periodic patterns.

The emissive display panel can further include an opaque layer between the emissive display panel and the spectrometer, where the opaque layer includes an aperture configured to allow the diffracted light to pass through the display panel and the opaque layer.

BRIEF DESCRIPTION OF THE DRAWINGS

FIG. 1A depicts a top (front) surface of a mobile computing device including a display and an optical device that occupy different portions of the front surface.

FIG. 1B depicts a top (front) surface of a mobile computing device including a display with a spectrometer positioned behind an area of the display according to a possible implementation of the disclosure.

FIG. 3A depicts a top (front) view of pixels and signal lines of a high-resolution portion of an emissive display according to a possible implementation of the disclosure.

FIG. 3B depicts a top (front) view of pixels and signal lines of a reduced-resolution portion of an emissive display according to a possible implementation of the disclosure.

The components in the drawings are not necessarily drawn to scale and may not be in scale relative to each other. Like reference numerals designate corresponding parts throughout the several views.

DETAILED DESCRIPTION

Figure 2A:
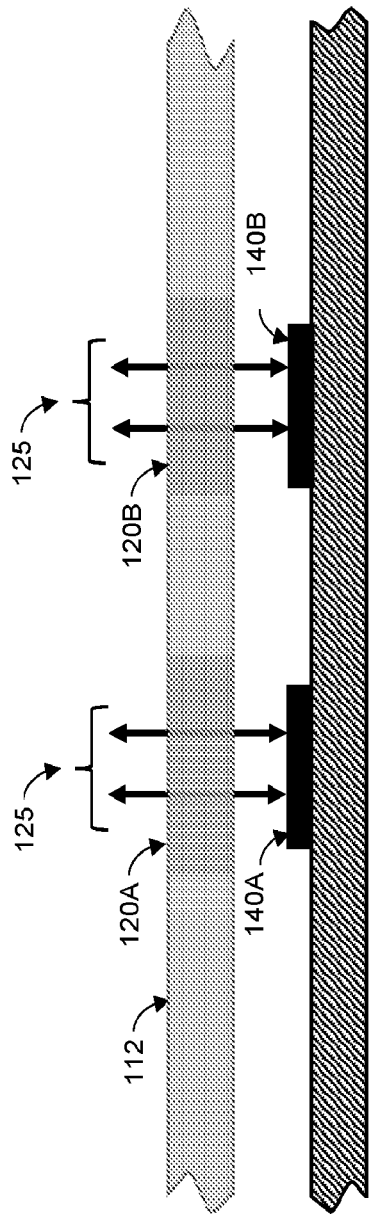
FIG. 2A depicts a side, cross-sectional view of a mobile device including a plurality of optical devices, each positioned behind an emissive display panel according to a possible implementation of the disclosure.

The present disclosure describes a flat panel display (i.e., display panel) that can be used with a mobile device (e.g., mobile phone, tablet, etc.). The front surface of a mobile device includes a display typically operating as a graphic user interface (GUI) and one or more optical devices operating as sensors/emitters in areas facing the front surface. The one or more optical devices can be configured for a variety of functions, including (but not limited to) sensing lighting conditions (e.g. light sensor), sensing proximity (e.g., electromagnetic sensor), capturing images (e.g., front-facing camera), and/or to providing light (e.g., flash).

Traditionally, the display and the optical devices have occupied separate areas of the front surface. For example, FIG. 1A depicts a mobile device 101 having a display 110 and a camera 111 that occupy different portions of the front surface. In addition to the camera 111, the mobile device 101 can include other optical elements that receive and sense optical signals, such as, for example, a spectrometer.

A spectrometer may be used to analyze incoming electromagnetic radiation to determine the constituent wavelengths of the incoming electromagnetic radiation and the irradiance, or power, in the different constituent wavelengths. The information provided by the spectrometer may be used in a variety of different ways. For example, spectrographic information can be used to determine ingredients or components of a product based on a spectrographic signature from the product. In another example, spectrographic information may be used to determine an authenticity of a product (e.g. a pharmaceutical product, a luxury consumer good, etc.) when the product has a known characteristic spectral signal that is not reproduced by a counterfeit product. In another example, spectrographic information may be used to determine a condition of an item. For example, the sugar content of fruit can change as the fruit ripens, and when the sugar content of the fruit affects the electromagnetic spectrum sensed from the fruit, the spectrometer can be used to determine a relative ripeness of the fruit. Health related information (e.g., blood oxygen saturation, body fat percentage, etc.) also can be detected by spectrographic means.

Recent advances in emissive display technology (e.g., active matrix organic light emitting diode (AMOLED)) facilitate extending the emissive (i.e., active) area of the display towards the edges of the mobile device. By extending the active area of the display towards the edges of the mobile device, a user may experience the benefits of a larger display without the drawbacks of a larger device. However, this may leave insufficient space for a spectrometer or other optical devices outside the area of the emissive display on the front side of the mobile device. In addition, adding spectrometer functionality to a mobile device includes providing a grating to diffract incoming light, and the grating can be yet another component to source, test, and integrate into the device.

The emissive display disclosed herein is configured to share the front surface of a mobile device with a spectrometer so that the active area of the display can be extended to the edges, without the need for leaving a gap in the display, or space around the display, for the spectrometer. Accordingly, one or more portions of the disclosed display panel covering the spectrometer can be configured so that the spectrometer, positioned under the display, can receive electromagnetic radiation (e.g., light) through the display, and the display itself can act as a grating to separate the received radiation into constituent wavelengths for spectrographic sensing and analysis.

FIG. 1B illustrates a mobile device 102 with a display 112 extended towards the edges of the device. Unlike mobile devices in which the display is excluded from an area reserved for optical devices, the light-emitting (i.e., active) area of the display 112 extends over substantially the entire front surface. Accordingly, nearly the entire front surface of the mobile device 102 may be used to present color, black-and-white, or gray-scale images, graphics, and/or characters. In some implementations, the display 112 can include one or more areas 120 behind which (i.e., below which) a spectrometer may be disposed.

The size, shape, and/or position of the area 120 may be implemented variously. For example, the area 120 shown in FIG. 1B has a rounded (e.g., circular) shape and is positioned apart from edges of the display 112. This need not be the case. For example, the area 120 can be rectangular in shape and can be positioned along an edge of the display 112.

Figure 2B:
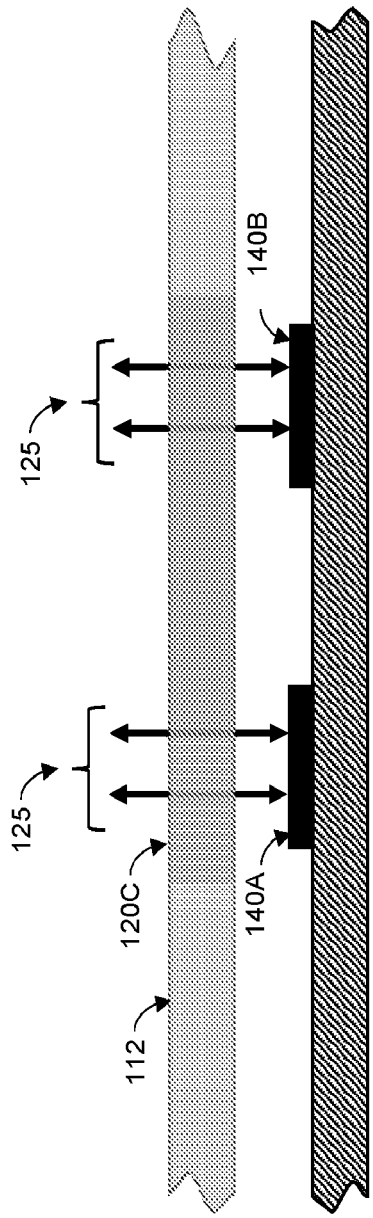
FIG. 2B depicts a side, cross-sectional view of a mobile device including a plurality of optical devices positioned behind an emissive display panel according to a possible implementation of the disclosure.

FIG. 2A depicts a side, cross-sectional view of a mobile device having a display 112 with areas 120A, 120B through which electromagnetic radiation can be transmitted to an underlying optical device, for example, a camera or a spectrometer. The mobile device can include multiple optical devices 140A, 140B, each positioned behind a different area 120A, 120B. FIG. 2B depicts a side, cross-sectional view of a mobile device having a display 112 with a single region for use by the multiple optical devices 140A, 140B.

The optical devices 140A, 140B may transmit and/or receive electromagnetic radiation 125 through the areas 120A, 120B, 120C. While the disclosure may be generally applied to any optical device configured to transmit or receive electromagnetic radiation (e.g., from the millimeter wave, visible, or infrared portions of the electromagnetic spectrum), the particular implementation of a spectrometer configured to receive visible light and/or infrared light will be considered throughout the disclosure.

In some implementations, the areas 120A, 120B, 120C of the display 112 through which light passes to an underlying sensor may have the same pixel density and/or pixel arrangement as in the rest of the display. In some implementations, the areas 120A, 120B, 120C of the display 112 through which light passes to an underlying sensor may have a different pixel density and/or pixel arrangement than the rest of the display. For example, in some implementations, the display region of the rest of display may have a pixel resolution that is higher than the pixel resolution of the areas 120A, 120B, 120C of the display through which light is transmitted to the spectrometer. FIG. 3A depicts possible pixels and signal lines of a high-resolution portion of an emissive display, while FIG. 3B depicts pixels and signal lines of a reduced-resolution portion of an emissive display. In FIG. 3A and in FIG. 3B, pixels in the display can include a plurality of light emitting elements (e.g., light emitting diodes) that emit different colors, so that all visible colors can be produced by a pixel by mixing amount of light from the different elements. For example, in some implementations, a pixel can include a red LED 302, a blue LED 304 and two green LEDs 306. The reduced-resolution portion may allow more light to pass through the display than the high-resolution portion of the display. The light passing through the display, however, may experience signal lines 242 running in a vertical (y) direction and/or in a horizontal (x) direction.

Figure 4:
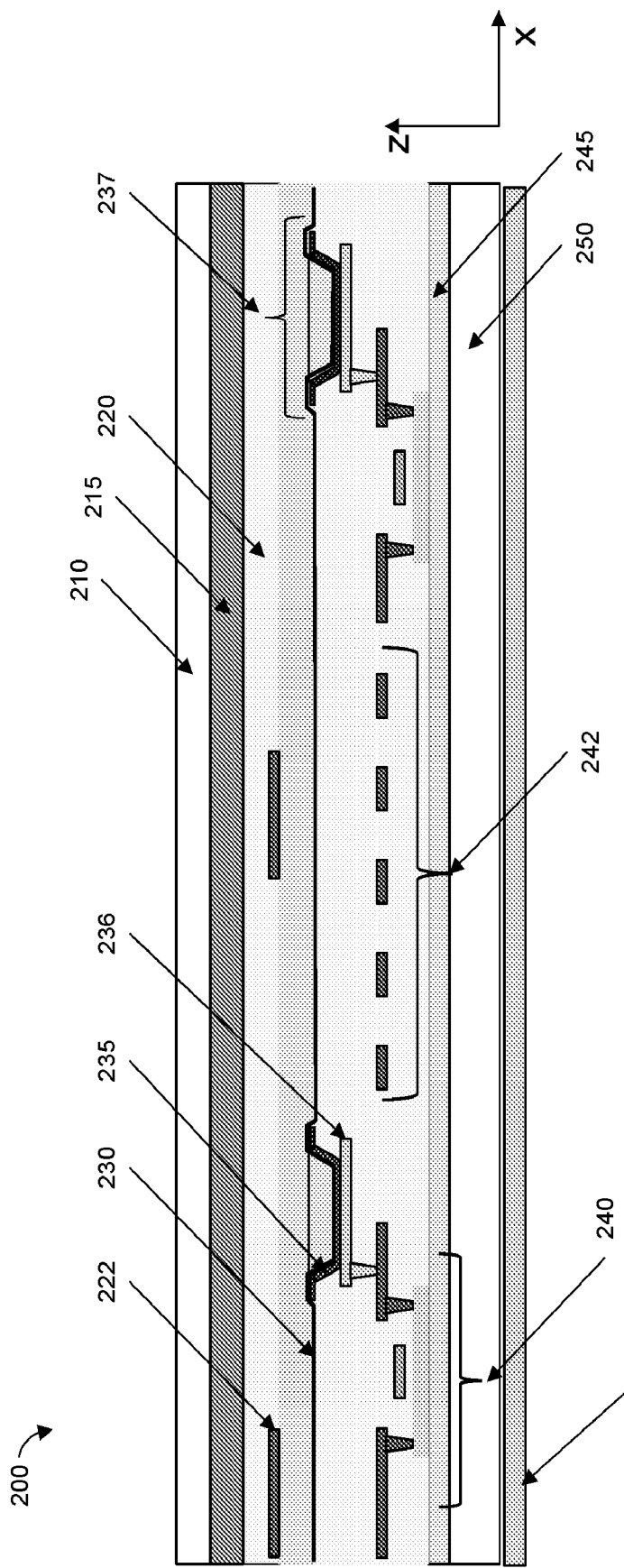
FIG. 4 depicts a possible side, cross-sectional view of the emissive display shown in FIG. 3B.

FIG. 4 illustrates a side, cross-sectional view of an emissive display panel 200 suitable for use with the mobile device of FIG. 1B. In one implementation, the display panel 200 can be an AMOLED display. While the principles of the disclosure may be applied to various other display technologies (e.g. LCD, LED), the implementation of an AMOLED display is considered throughout the disclosure.

As shown in FIG. 4, the AMOLED display panel 200 includes a plurality of layers. The layers are positioned behind (i.e., below) a cover glass layer 210 that can form the front surface of the mobile device 102. In a possible implementation, the display panel 200 can include a polarizer film layer 215. The display panel 200 can also include a touch sensor layer 220 that includes touch sensor electrodes 222. Pixels 237 for the display are formed from a cathode layer 230, an OLED emitter stack 235, and separate elements of an anode layer 236. Elements of the anode layer 236 may be reflective so that light is directed in a vertical (z) direction from the anode layer 236. An element of the anode layer 236 can be coupled to a thin film transistor (TFT) structure 240 that includes a source, a gate, and a drain, which can be controlled by electrical signals transmitted over signal lines 242. The display panel 200 can further include a barrier layer 245 of SiNx or SiONx and a substrate layer 250 of polyimide (PI). A metallic layer/film 410 for heat spreading and electrical shielding can be located below the display panel 200 to protect the display from localized hot spots due to heat-generating elements in the mobile device, such as, for example, a CPU, a GPU, etc., as well as from electrical signal noise from the underneath electrical components.

The layers of the display panel 200 may include transparent and non-transparent circuit elements. For example, the TFT structure 240, the pixels 237, the signal lines 242, and/or touch sensor electrodes 222 may all block light from propagating through the display panel 200. Light can be either reflected or absorbed by the non-transparent (e.g., opaque) circuit elements. Additionally, the circuit elements may define gaps (e.g., periodic slits) with which the light may interact. For example, light may be diffracted by gaps formed between adjacent circuit elements in the same layer. Light may also be diffracted by gaps between circuit elements in different layers, although the effect may be weaker than the diffraction due to elements of the same layer.

Figure 5:
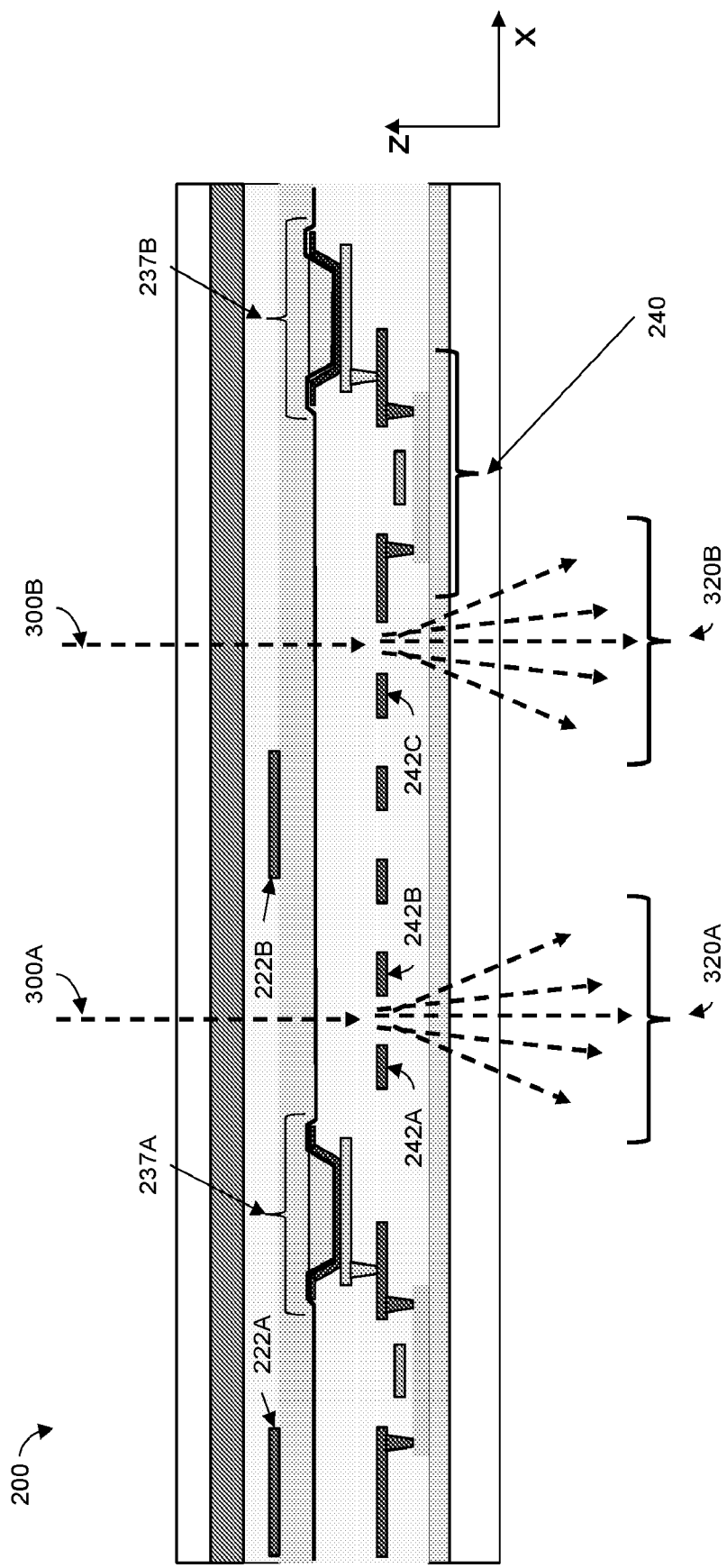
FIG. 5 depicts the possible effects on light passing through the emissive display of FIG. 4.

FIG. 5 depicts a side, cross-sectional view of a portion of the display panel 200 of FIG. 4 with light diffracted by circuit elements in the display. As shown, light 300A may pass between touch sensor electrodes 222A, 222B and between pixels 237A, 237B without being altered significantly when the distances between adjacent electrodes 222A, 222B and between adjacent pixels 237A, 237B are large compared to the wavelength of the light. The light 300A can be diffracted, however, by a gap formed between two adjacent signal lines 242A, 242B that are placed close to each other with a narrow gap between the two signal lines 242A, 242B. The dimension of a gap relative to the wavelength of the light 300A, 300B can determine the effect the gap has on the light. For example, a degree of diffraction of light can depend on a relative size of the gap ("d") compared with a wavelength ("$\lambda$") of the light. When $d \gg \lambda$, there is very little diffraction, and when $d \ll \lambda$, very little light passes through the gap, but when $d \sim \lambda$, significant diffraction of light may occur. Accordingly, light may diffracted by gaps formed by other combinations of circuit elements provided the gaps formed are of suitable dimensions. For example, light 300B diffracted by a first gap formed between a signal line 242C and a TFT structure 240 can be diffracted differently than light 300A that is diffracted by a second gap between adjacent signal lines 242A, 242B, when the first and second gaps have different relative sizes compared with the wavelength of light that passes through the gaps.

When light diffracts, diffraction may be understood as effectively changing propagation directions of portions of the light, so that the diffracted light 320A, 320B is distributed over a diffraction angle. In general, narrower gaps in the display result in larger diffraction angles.

Although diffraction of light by sensor electrodes 222A, 222B, pixels 237A, 237B, signals lines 242A, 242B, 242C, and TFT structures 240 can be a hinderance when optically imaging light that passes though the display panel 200 onto a sensor located below the display (e.g., onto a sensor of a camera located below the display), the diffraction of the light by diffracting elements in the display can be exploited advantageously to obtain spectrographic information about the light that passes through the display panel 200.

Figure 6:
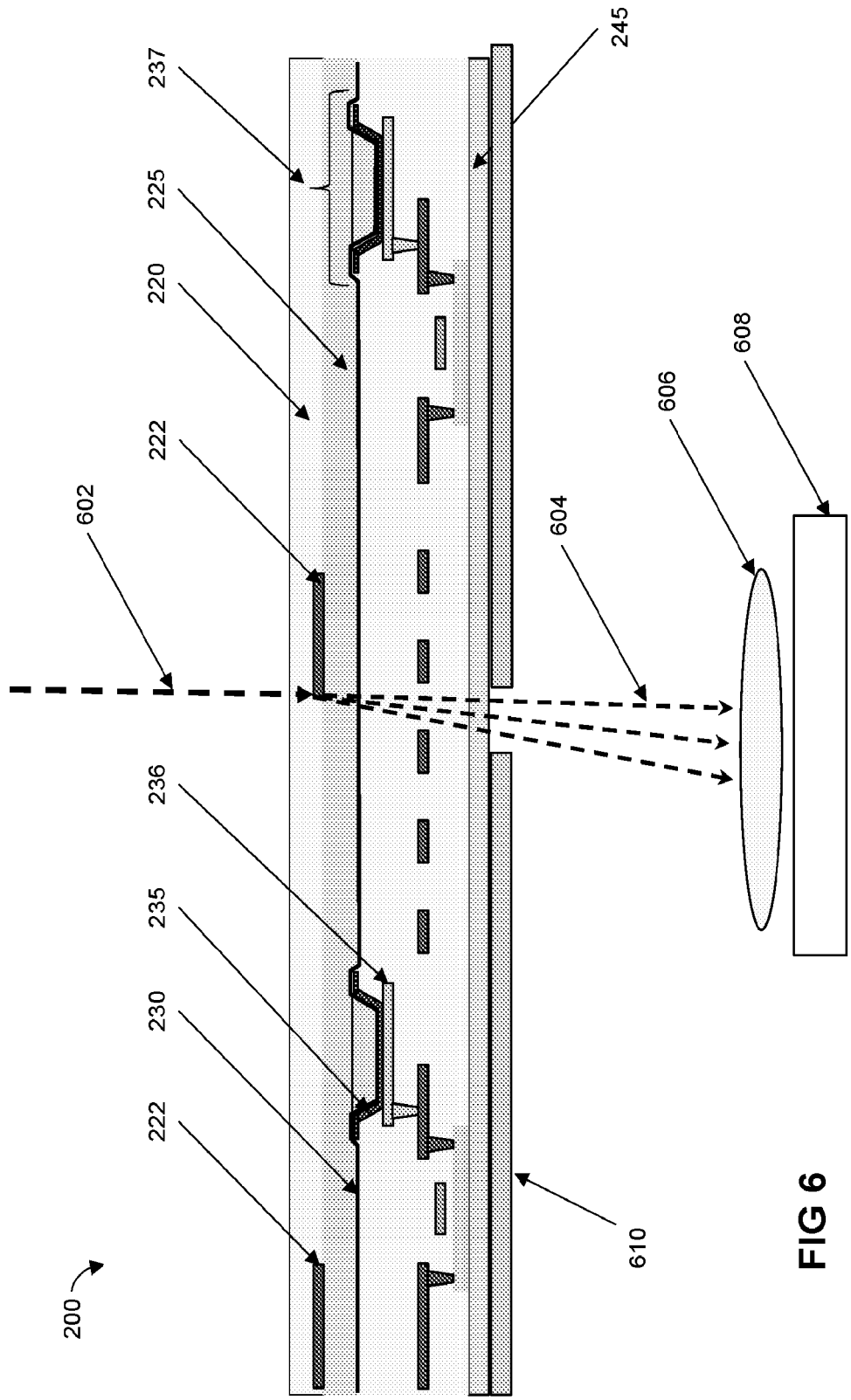
FIG. 6 is a schematic diagram of wavelength-dependent diffraction of light by diffractive elements of an emissive display.

For example, FIG. 6 is a schematic diagram of wavelength-dependent diffraction of light by a diffractive element of an emissive display panel 200. Incoming broad-spectrum light 602 can interact with a diffractive element of the emissive display, for example, a touch sensor electrode 222, and different wavelengths of the broad-spectrum light can be diffracted by different amounts. The diffracted light 604 can be imaged (e.g., by a lens 606) onto an optical sensor array 608, on which different ranges of wavelengths are resolved on different pixels of the array 608. In some implementations, a fiber optic plate can be substituted for the lens 606, which may shorten the distance between the diffractive elements of the emissive display and the optical sensor array or provide a curved image plane. Intensities of the separately resolved wavelength ranges can be used to determine a spectrogram of the incoming light. A heat spreading layer 610 can be located below the display panel 200 to protect the display from localized hot spots due to heat-generating elements in the mobile device, such as, for example, a CPU, a GPU, etc. The heat spreading layer 610 may include metal and may be optically opaque, with a small opening created in the layer 610 to allow light to pass through the display to the optical sensor array 608 located below the display panel 200.

Figure 7:
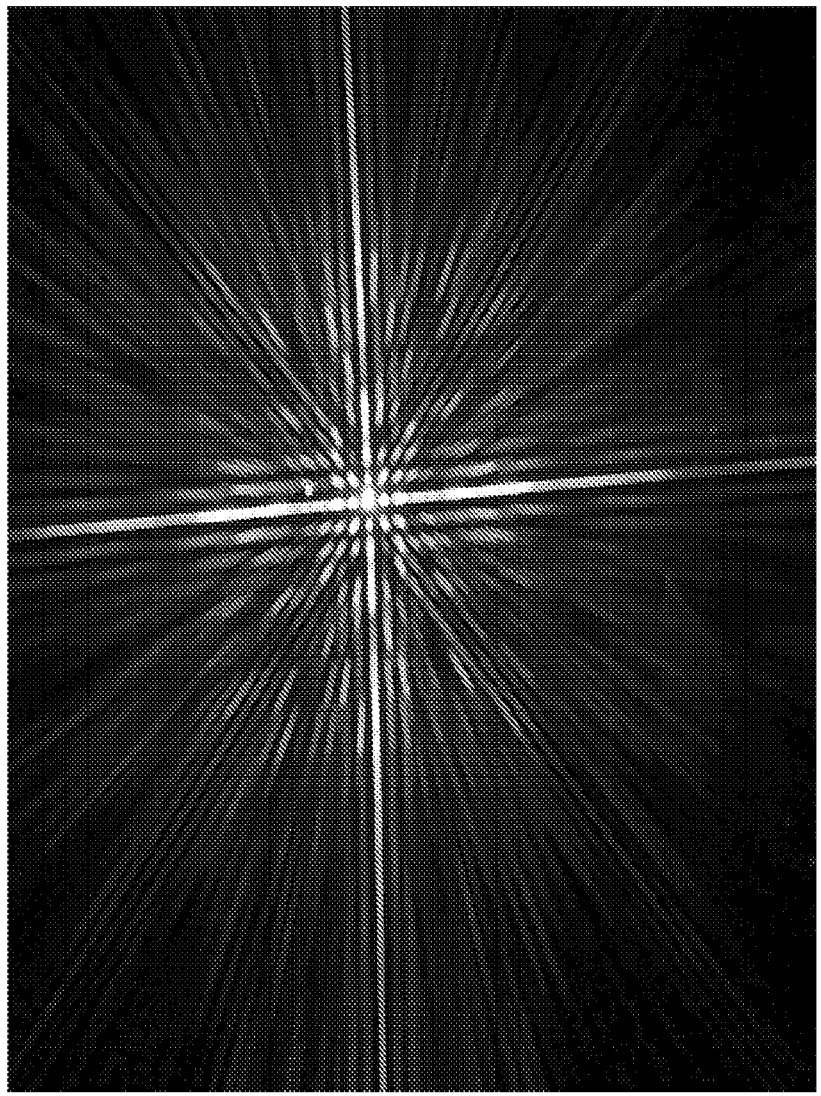
FIG. 7 shows a measured point spread function of light that is diffracted by a two-dimensional array of diffractive elements in an emissive display.

The schematic diagram of FIG. 6 shows a simplified diffraction pattern due to the interaction of a light beam with one edge of a diffracting element. In practice, incoming light is diffracted by a more complicated pattern of a plurality of diffracting elements in the emissive display 200. For example, referring again to FIG. 3B, when incoming light passes through a portion of the display, which includes a plurality of pixels, with each pixel including a plurality LEDs and a plurality of signals lines, the incoming light is diffracted by a plurality of elements. However, because of the spatial periodicity of the diffractive elements in the emissive display, the display can act as a two-dimensional diffraction grating for incoming light. FIG. 7 shows a measured point spread function of light that is diffracted by a real-world two-dimensional array of diffractive elements in an emissive display, where features of the spatial pattern of the two-dimensional pattern of diffractive elements in the emissive display are echoed in the point spread function shown in FIG. 7.

An optical sensor array 608 can be positioned under the emissive display panel 200 at a location and orientation corresponding to a portion of the point spread function that features good chromatic resolution in the diffraction pattern of light due to diffractive elements in the emissive display. Then, signals on the sensor array can be used to determine a spectrum of the incoming light that passes through the emissive display panel 200 to the optical sensor array 608.

Figure 8:
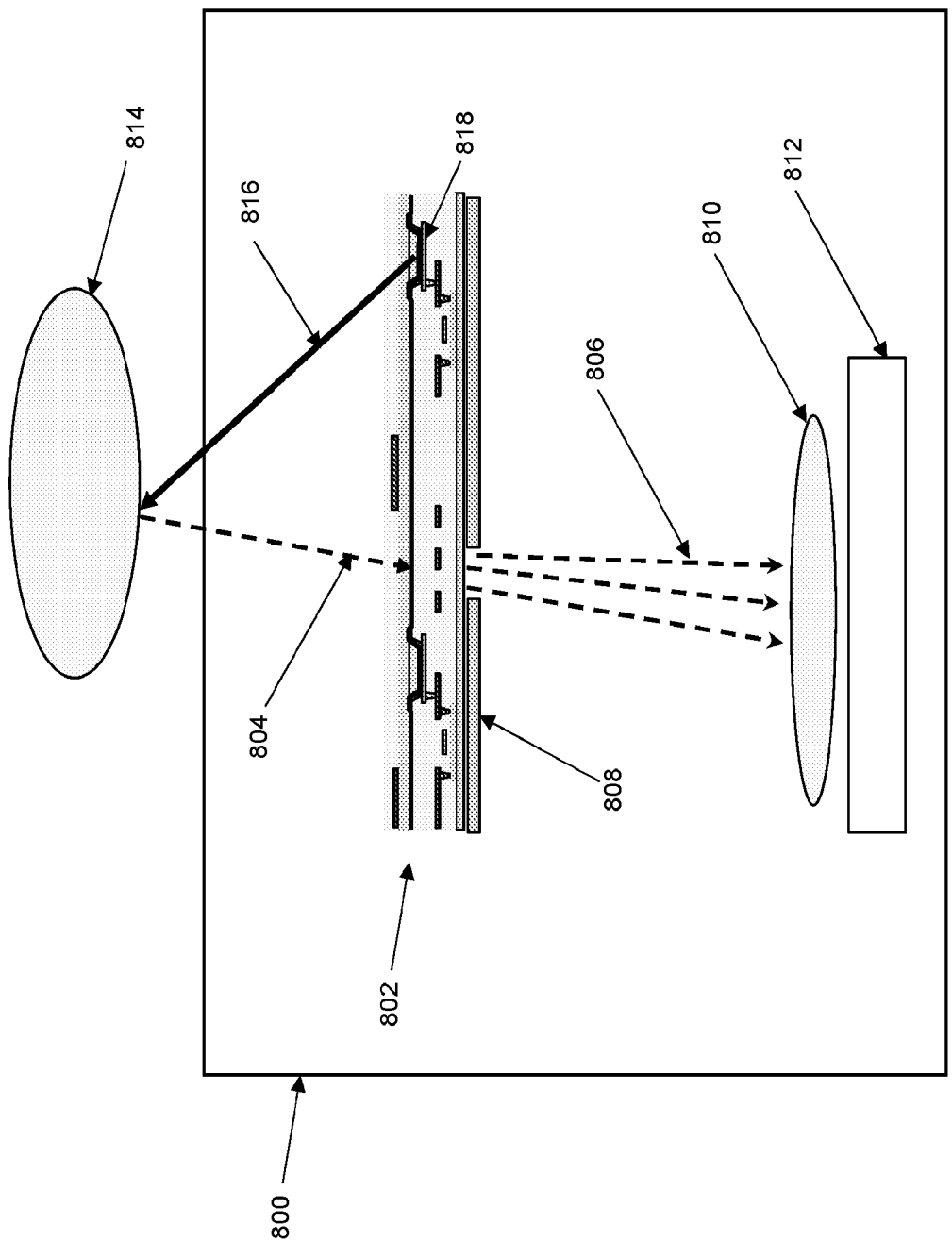
FIG. 8 is a schematic diagram of a mobile device having an emissive display that includes a periodic pattern of diffractive elements that can diffract incoming light as the light passes through the display.

FIG. 8 is a schematic diagram of a mobile device 800 having an emissive display 802 that includes a periodic pattern of diffractive elements that can diffract incoming light 804 as the light passes through the display 802. The diffracted light 806 can pass through an aperture in an opaque layer 808 below the emissive display 802 and can be imaged (e.g., by a lens 810) onto an optical sensor array 812 that can measure a spectrum of the incoming light 804. In some implementations, a fiber optic plate can be substituted for the lens 810, which may shorten the distance between the diffractive elements of the emissive display and the optical sensor array. The incoming light 804 can be received from an object of interest 814, and the object of interest 814 can be illuminated by light 816 that is provided from one or more LEDs 818 in the emissive display 802. The light 816 provided by the emissive display 802 can have spectral characteristics determined by the device 800. For example, light provided from an AMOLED emissive display 802 can exhibit a spectrum having relatively higher intensities near the wavelengths corresponding to band gaps of individual OLED emitters in the display. In some implementations, the optical sensor array 812 under the display panel 802 can be calibrated for use with light provided by the emissive display panel. For example, prior to using the mobile device 800 to measure spectrum received from an unknown object, the optical sensor array can be a calibrated by providing light from the emissive display 802 to an object having a known spectral response and measuring the spectrum of light received from the object in response to the provided light to establish a baseline response for the array 812. The baseline response of the array can be stored in a memory of the device 800. Then, when light is provided from the display 802 to an unknown object, the spectrum of light received by the array 812 in response can be compared to the baseline to determine a spectrum from the unknown object. In some implementations, the mobile device 800 can be used to determine a spectrum of a self-emitting object or of an ambient light and then the spectral characteristics of the light 816 provided by the one or more LEDs can be selected such that the light 816 has an irradiance distribution over a range of wavelengths of interest, which, when added to the ambient light that falls one the object of interest 814, has a uniform irradiance distribution over a range of wavelengths of interest at the object.

Figure 9:
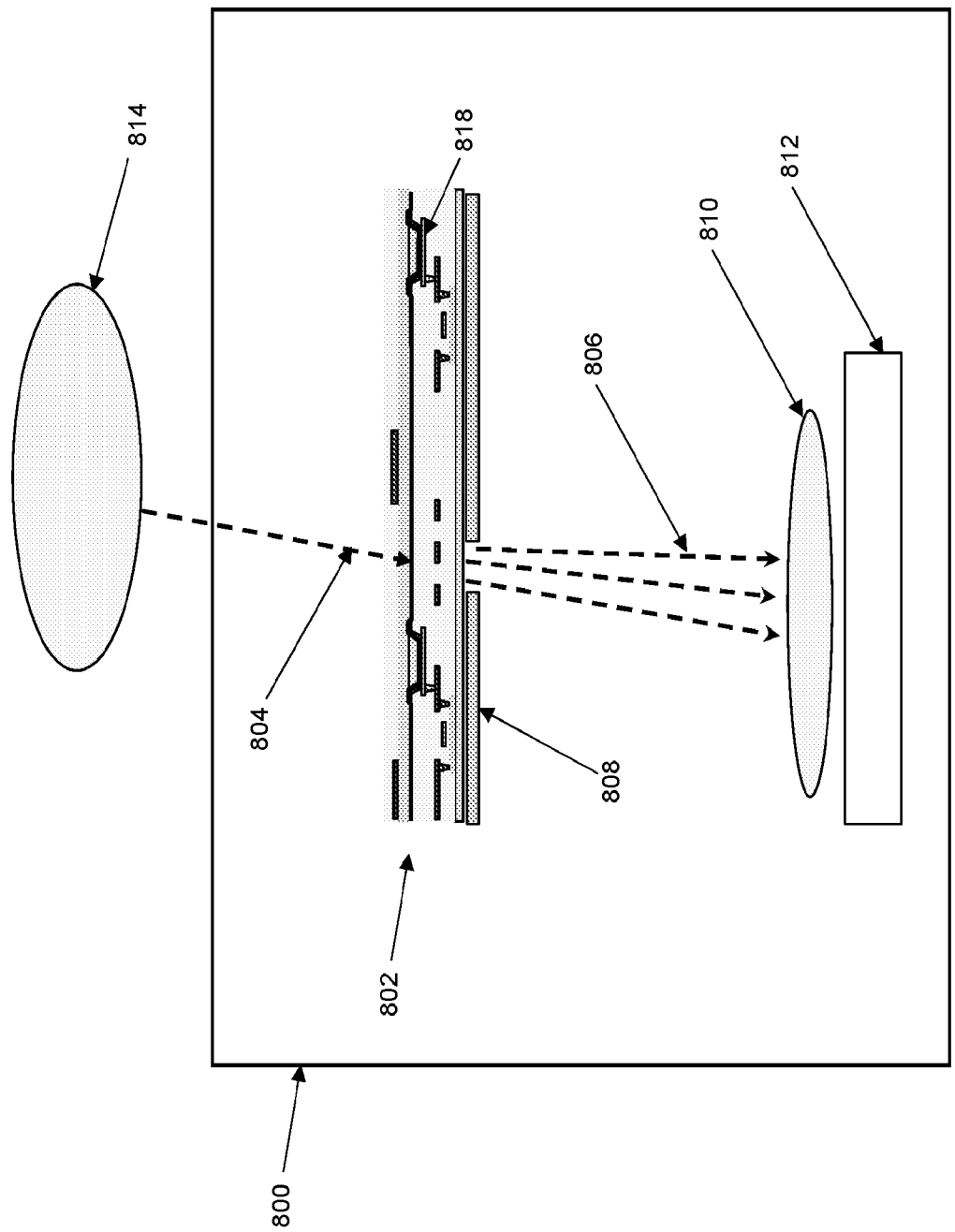
FIG. 9 is a schematic diagram of the mobile device having an emissive display that includes a periodic pattern of diffractive elements that can diffract incoming light as the light passes through the display when the device is used in an ambient light illumination mode.

FIG. 9 is a schematic diagram of the mobile device 800 when used in an ambient light illumination mode. Ambient light can illuminate the object of interest 814, and then light received from the object of interest 814 can pass through the aperture in the opaque layer 808 below the emissive display panel 802 and can be imaged onto the optical sensor array 812 that can measure a spectrum of the incoming light 804. The optical sensor array 812 can also measure the spectrum of ambient light diffracted by the pattern of diffracting elements in the emissive display 802 to analyze the spectral characteristics of the ambient light itself. The information about the ambient light spectrum can be used be used for applications, such as, for example, adaptive brightness of the emissive display.

The disclosed displays have been presented in the context of a mobile device, such as a tablet or a smart phone. The principles and techniques disclosed, however, may be applied more generally to any display in which it is desirable to position a sensor behind the display. For example, a virtual agent home terminal, a television, or an automatic teller machine (ATM) are a non-limiting set of alternative applications that could utilize a camera positioned behind an active area of a display. Further, the motivation for placing a spectrometer behind a display is not limited to an expansion of the display to the edges of a device. For example, it may be desirable to place the spectrometer behind a display for aesthetic or stealth reasons.

In the specification and/or figures, typical embodiments have been disclosed. The present disclosure is not limited to such exemplary embodiments. The use of the term "and/or" includes any and all combinations of one or more of the associated listed items. Unless otherwise noted, specific terms have been used in a generic and descriptive sense and not for purposes of limitation. As used in this specification, spatial relative terms (e.g., in front of, behind, above, below, and so forth) are intended to encompass different orientations of the device in use or operation in addition to the orientation depicted in the figures. For example, a "front surface" of a mobile computing device may be a surface facing a user, in which case the phrase "in front of" implies closer to the user. Additionally, a "top surface" of a display may be the surface facing a user, in which case the phrase "below" implies deeper into an interior of the mobile computing device.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components, and/or features of the different implementations described.

What is claimed is:

1. A mobile computing device comprising:
   an emissive display panel, wherein the emissive display panel includes an active portion that is usable to present images, the active portion of the emissive display panel including:
      a first periodic pattern of pixels that include one or more LEDs; and
      a second periodic pattern of circuit elements that control the pixels, wherein the first periodic pattern of pixels and the second periodic pattern of circuit elements that control the pixels are configured to diffract light received from outside the mobile computing device, which passes through the emissive display panel, wherein the diffraction of the light is wavelength-dependent;
   an optical sensor array positioned below the active portion of the emissive display panel and arranged to receive the light which is diffracted by the first periodic pattern of pixels and the second periodic pattern of circuit elements that control the pixels; and
   a processor configured to analyze the light received by the optical sensor array and determine intensities of different wavelength ranges of the light diffracted by the first period pattern of pixels and the second period pattern of circuit elements from the active portion of the display panel.

2. The mobile computing device according to claim 1, wherein the emissive display panel includes an active matrix organic light emitting diode (AMOLED) display panel.

3. The mobile computing device according to claim 1, wherein the circuit elements that control the pixels are arranged to form openings for light to pass through.

4. The mobile computing device according claim 1, wherein the one or more LEDs are configured to provide light to an object that reflects the light that thereafter is diffracted by the first periodic pattern of pixels and by the second periodic pattern of circuit elements that control the pixels.

5. The mobile computing device according to claim 1, further comprising a fiber plate between the emissive display panel and the optical sensor array, wherein the fiber plate is configured to image the diffracted light onto the optical sensor array.

6. The mobile computing device according to claim 1, further comprising a lens positioned between the emissive display panel and the optical sensor array, wherein the lens is configured to image the diffracted light onto the optical sensor array.

7. The mobile computing device of claim 1, further comprising an opaque layer between the emissive display panel and the optical sensor array, wherein the opaque layer includes an aperture configured to allow the diffracted light to pass to the optical sensor array.

8. The mobile computing device of claim 1, wherein the processor is configured to process signals from the optical sensor array, to determine that a product from which the diffracted light is received is authentic or genuine, based on the determined intensities of the different wavelength ranges of the diffracted light.

9. The mobile computing device of claim 1, wherein the first periodic pattern of pixels and the second periodic pattern of circuit elements that control the pixels diffract different ranges of wavelengths of the light to different pixels of the optical sensor array, such that components of the emissive display panel function as grating to separate the light received from outside the mobile computing device into the different ranges of wavelengths.

10. The mobile computing device of claim 9, wherein the light diffracted onto the optical sensor array forms a point spread function.

11. The mobile computing device of claim 1, wherein the processor determines a spectrogram of the light received from outside the mobile computing device based on the determined intensities of the different wavelength ranges of the diffracted light.

12. The mobile computing device of claim 11, wherein the processor determines the spectrogram of the light received from outside the mobile computing device by comparing the determined intensities of the different wavelength ranges of the light to a baseline response to sensed light.

13. The mobile computing device of claim 12, comprising memory storing the baseline response to sensed light.

14. The mobile computing device of claim 12, wherein the baseline response to sensed light was determined based on the optical sensor array measuring a spectrum of light received from an object with a known spectral response.

15. The mobile computing device of claim 1, wherein the active portion of the emissive display panel through which the light received by the optical sensor array passes has a same density of pixels as a remainder of the display panel.

16. The mobile computing device of claim 15, wherein the active portion of the emissive display panel through which the light received by the optical sensor array passes has a same arrangement of pixels as the remainder of the display panel.

* * * * *